(12) United States Patent
Daubenspeck et al.

(10) Patent No.: US 8,680,689 B1
(45) Date of Patent: Mar. 25, 2014

(54) COPLANAR WAVEGUIDE FOR STACKED MULTI-CHIP SYSTEMS

(71) Applicant: International Business Machines Corporation, Armonk, NY (US)

(72) Inventors: Timothy H. Daubenspeck, Colchester, VT (US); Hanyi Ding, Colchester, VT (US); Wolfgang Sauter, Hinesburg, VT (US); Guoan Wang, Lexington, SC (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/644,269

(22) Filed: Oct. 4, 2012

(51) Int. Cl.
*H01L 21/31* (2006.01)

(52) U.S. Cl.
USPC ............. 257/778; 257/774; 257/775; 385/14; 385/15; 385/37; 385/42

(58) Field of Classification Search
USPC ........ 257/774–775, 764, 778; 385/14–15, 37, 385/42, 50, 129, 131
See application file for complete search history.

(56) References Cited

U.S. PATENT DOCUMENTS

| | | | |
|---|---|---|---|
| 5,014,115 A | 5/1991 | Moser | |
| 6,137,693 A | 10/2000 | Schwiebert et al. | |
| 6,194,669 B1 | 2/2001 | Bjorndahl et al. | |
| 6,661,100 B1 | 12/2003 | Anderson et al. | |
| 6,661,939 B2 | 12/2003 | Kaneko et al. | |
| 6,730,860 B2 | 5/2004 | Searls et al. | |
| 6,825,554 B2 | 11/2004 | Liew et al. | |
| 6,901,086 B2* | 5/2005 | Li | 372/7 |
| 6,992,255 B2 | 1/2006 | Oprysko et al. | |
| 6,996,899 B2 | 2/2006 | Searls et al. | |
| 6,998,711 B1 | 2/2006 | Farrar | |
| 2003/0015804 A1 | 1/2003 | Staiculescu et al. | |
| 2010/0059896 A1* | 3/2010 | Makita et al. | 257/775 |
| 2011/0042672 A1* | 2/2011 | Makita | 257/51 |
| 2011/0142392 A1 | 6/2011 | Tilly | |
| 2011/0248396 A1 | 10/2011 | Liu et al. | |
| 2012/0139092 A1 | 6/2012 | Su et al. | |
| 2012/0175789 A1 | 7/2012 | Farooq et al. | |
| 2012/0181071 A1 | 7/2012 | Jadhav et al. | |

OTHER PUBLICATIONS

Chen, et al., "Vertical RF Transition with Mechanical Fit for Three-Dimensional Heterogeneous Integration", Proceedings of the 3rd European Microwave Integrated Circuits Conference, Oct. 2008, pp. 534-537, Amsterdam, Netherlands.

Wu, et al., "Coaxial Transitions for CPW-to-CPW flip chip interconnects", Electronics Letters vol. 43, No. 17, Aug. 16, 2007, 2 Pages.

Hirose, et al., "A Flip-Chip MMIC Design with CPW Technology in the W-Band", WE2A-3, 1998 IEEE MTT-S Digest, pp. 525-528.

(Continued)

*Primary Examiner* — Dung A. Le

(74) *Attorney, Agent, or Firm* — David Cain; Roberts Mlotkowski Safran & Cole, P.C.

(57) ABSTRACT

An approach for a coplanar waveguide structure in stacked multi-chip systems is provided. A method of manufacturing a semiconductor structure includes forming a first coplanar waveguide in a first chip. The method also includes forming a second coplanar waveguide in a second chip. The method further includes directly connecting the first coplanar waveguide to the second coplanar waveguide using a plurality of chip-to-chip connections.

20 Claims, 6 Drawing Sheets

(56) References Cited

OTHER PUBLICATIONS

Woods, et al., "Vertically-Stacked On-Chip SiGe/BiCMOS/RFCMOS Coplanar Waveguides", 2004 IEEE, pp. 245-247.

Flip Chip International, LLC, "Cu Pillar Bump-Repassivation (Spheron)" http://www.flipchip.com/bumping-design-options/bump-heights-130um/cu-pillar-bump-repassivation-spheron, 2 pages, downloaded Oct. 3, 2012.

* cited by examiner

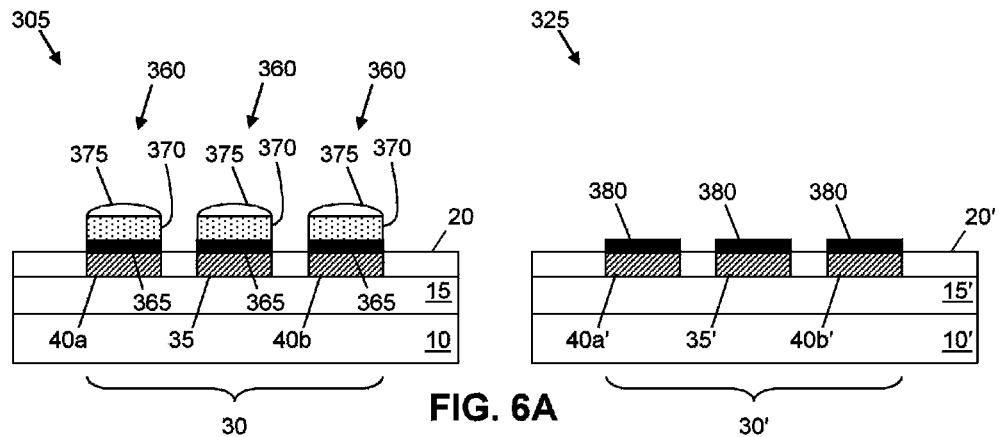
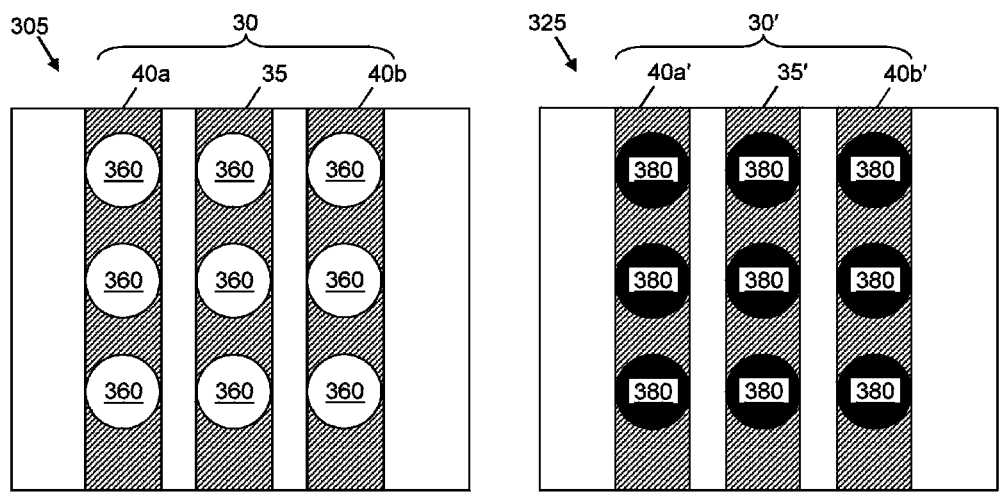
FIG. 6A
FIG. 6B

COPLANAR WAVEGUIDE FOR STACKED MULTI-CHIP SYSTEMS

FIELD OF THE INVENTION

The present invention relates to integrated circuit devices and, more particularly, to coplanar waveguide structures in stacked multi-chip systems.

BACKGROUND

There is a continuous drive in the electronics industry to decrease the size of electronic devices in order to produce smaller packages and/or accommodate more electronic devices into existing packages. To this end, there is an increasing interest in using three dimensional (3D) stacked multi-chip semiconductor processes (e.g., through-silicon-vias (TSV), etc.) and package solutions to shrink the overall size of high-performance electronic systems. Chip stacking, or 3D integration, is the process of vertically assembling two or more integrated circuit (IC) chips so that the semiconductor chips that are placed in physical proximity to one another are also electrically connected to one another.

The effectiveness of a device in an integrated circuit chip is often affected when the size of the device is decreased. A common type of device in a chip is an on-chip transmission line comprising a coplanar waveguide (CPW). A traditional coplanar waveguide comprises a signal line flanked by two ground lines. All three lines, e.g., the signal line and the two ground lines, are formed in a common wiring level of a layered semiconductor structure and thus are coplanar in a substantially horizontal plane. The ever-present drive to reduce the size of integrated circuits has resulted in the shrinkage of the signal and ground lines in coplanar waveguides, which affects the signal-carrying effectiveness of a transmission lines comprising a coplanar waveguide.

Accordingly, there exists a need in the art to overcome the deficiencies and limitations described hereinabove.

SUMMARY

In a first aspect of the invention, a method of manufacturing a semiconductor structure includes forming a first coplanar waveguide in a first chip. The method also includes forming a second coplanar waveguide in a second chip. The method further includes directly connecting the first coplanar waveguide to the second coplanar waveguide using a plurality of chip-to-chip connections.

In another aspect of the invention, a method of forming a semiconductor structure includes: forming a first coplanar waveguide comprising a signal line and ground lines in top layer of a first chip; and forming a second coplanar waveguide comprising a signal line and ground lines in top layer of a second chip. The method also includes forming a plurality of connection structures on each of the signal line of the first coplanar waveguide and the ground lines of the first coplanar waveguide. The method further includes connecting the signal line of the second coplanar waveguide and the ground lines of the second coplanar waveguide to the plurality of connection structures.

In yet another aspect of the invention, a semiconductor structure includes a composite coplanar waveguide comprising: a first coplanar waveguide in a first chip; a second coplanar waveguide in a second chip; and a plurality of chip-to-chip connections that directly connect the first coplanar waveguide to the second coplanar waveguide.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a composite coplanar waveguide which comprises the structures of the present invention. In still further embodiments, a method in a computer-aided design system is provided for generating a functional design model of the composite coplanar waveguide. The method comprises generating a functional representation of the structural elements of the composite coplanar waveguide.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1, 2A, 2B, 3A 3B, 4, 5, 6A, 6B, and 7 show processing steps and structures in accordance with aspects of the invention;

DETAILED DESCRIPTION

The invention relates to integrated circuit devices and, more particularly, to coplanar waveguide structures in stacked multi-chip systems. According to aspects of the invention, first and second coplanar waveguides formed in two separate chips are connected by a plurality of interconnects arranged between the two chips in a stacked chip (e.g., 3D integration) module. In embodiments, the first and second coplanar waveguides are formed in last layers (e.g., topmost layers) of the two chips, and the interconnects between the two chips are directly on and contacting the coplanar waveguides. In particular embodiments, the interconnects are micro-C4 (controlled collapse chip connect) solder balls or copper pillars. In this manner, implementations of the invention provide a single relatively large coplanar waveguide (referred to herein as a 3D coplanar waveguide) formed by connecting two relatively smaller coplanar waveguides in a stacked chip (e.g., 3D integration) module.

In accordance with aspects of the invention, the signal and ground lines in the 3D coplanar waveguide are thicker than each of the individual signal and ground lines in the two coplanar waveguides from which it is formed. The 3D coplanar waveguide thus provides the opportunity for use with high-frequency signals and/or mixed signal environments such as clock signals, controlled impedance lines, and microwave-millimeter wave (MMW) interconnects. The 3D coplanar waveguide in accordance with aspects of the invention also exhibits less loss than the individual smaller coplanar waveguides from which it is formed. The lower energy loss exhibited by the 3D coplanar waveguide may be leveraged to extend the battery life of rechargeable wireless communication devices, such as wireless telephones, personal digital assistants, tablet computers, etc. Implementations of the present inventive 3D coplanar waveguide may be particularly useful in integrating MMW frequency systems alongside digital systems in a stacked chip (e.g., 3D integration) module. For example, wireless communication devices (e.g., wireless telephones, personal digital assistants, tablet computers, etc.) may utilize implementations of the 3D coplanar waveguide to use a 60 GHz signal to wirelessly broadcast HDTV (high definition television) signals directly to a nearby television.

Figure 1:
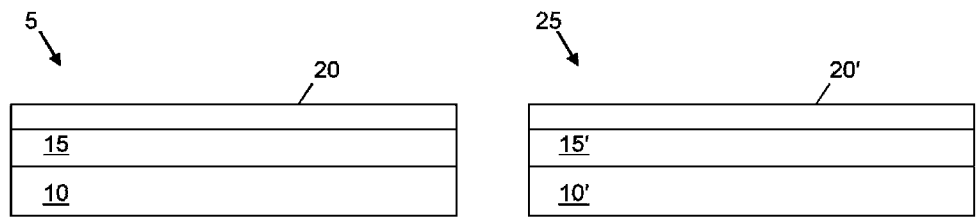

FIGS. 1, 2A, 2B, 3A 3B, 4, 5, 6A, 6B, and 7 show processing steps and respective structures in accordance with aspects of the invention. In particular, FIG. 1 shows a cross section of a portion of a first structure 5 that has undergone CMOS (complementary metal oxide semiconductor) processing. The first structure 5 may comprise a substrate 10. The substrate 10 may be composed of any suitable material or combination of materials, such as doped or undoped silicon, glass, etc. The substrate 10 may have any suitable configuration, such as, for example, semiconductor-on-insulator (SOI), bulk silicon, etc. The substrate 10 may comprise any number and type of integrated circuit devices, including, but not limited to: field effect transistors (FET), capacitors, resistors, etc.

The first structure 5 also includes an intermediate layer 15 on the top surface of the substrate 10. The intermediate layer 15 may comprise one or more interlevel dielectric (ILD) layers. The intermediate layer 15 may also comprise any number and arrangement of electrically conductive pathways formed within the one or more ILD layers, such as contacts for devices formed in the substrate, vias, interconnects, wires, etc., as are understood to those of ordinary skill in the art such that further explanation is not necessary. The ILD layers may be, for example, oxide.

The first structure 5 also includes a top layer 20 on the intermediate layer 15. The top layer 20 may also be referred to as a last layer or an uppermost wiring level. In embodiments, the top layer 20, like the one or more ILD layers, is composed of a dielectric material and is formed using conventional semiconductor processing techniques. For example, the top layer 20 may comprise silicon dioxide or any other suitable dielectric material.

FIG. 1 also shows a second structure 25 comprising a substrate 10', intermediate layer 15', and top layer 20'. At the stage of processing shown in FIG. 1, the second structure 25 is physically separate from the first structure 5. For example, the first structure 5 may be a portion (e.g., chip, die, etc.) of a first wafer undergoing CMOS processing, and the second structure 25 may be a portion (e.g., chip, die, etc.) of a second wafer undergoing separate CMOS processing. Alternatively, the first structure 5 and second structure 25 may be different areas on a single wafer. The substrate 10', intermediate layer 15', and top layer 20' may be similar to the substrate 10, intermediate layer 15, and top layer 20, although it is understood that the second structure 25 may have a different arrangement of devices in its substrate 10' and/or intermediate layer 15' than are found in the substrate 10 and/or intermediate layer 15 of the first structure 5.

Figure 2A:
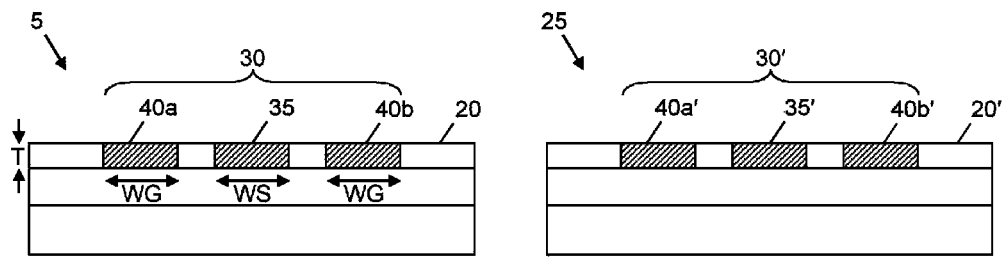

As depicted in FIG. 2A, a first coplanar waveguide 30 is formed in the top layer 20 of the first structure 5. In embodiments, the first coplanar waveguide 30 comprises a signal line 35 flanked by two ground lines 40a and 40b, with portions of the top layer 20 between the signal line 35 and each respective ground line 40a and 40b.

The first coplanar waveguide 30 may be formed using conventional CMOS techniques, such as lithography (e.g., masking and etching), deposition, and planarization processes. For example, in forming the first coplanar waveguide 30, a photomask may be provided by forming a layer of photoresist material on the top layer 20, exposing the photoresist material to a pattern of light, and developing the exposed photoresist material. An etching process, such as one or more reactive ion etch (RIE) processes, may then be used to form trenches (e.g., holes) in the top layer 20 by removing material of the top layer 20 that is not covered by the photomask. After etching, the photomask may be removed using a conventional ashing or stripping process.

A deposition process, such as chemical vapor deposition (CVD), sputter deposition, etc., may then be used to fill the trenches in the top layer with an electrically conductive material, such as copper (Cu), aluminum (Al), or other suitable material. A planarization process, such as chemical mechanical polish (CMP), may be used to remove excess material from the top surface of the first structure 5 to form a substantially planar surface. The electrically conductive material remaining in the trenches after the CMP constitutes the signal line 35 and ground lines 40a and 40b of the first coplanar waveguide 30.

The signal line 35 and ground lines 40a-b may have any suitable dimensions. For example, in embodiments, the signal line 35 has a width "WS" of about 2 μm, and each of the ground lines 40a-b has a width "WG" of about 7 μm. The signal line 35 and ground lines 40a-b have the same height (e.g., in the vertical direction relative to the structure 5) corresponding to the height (e.g., thickness) "T" of the top layer 20, which, in embodiments, is about 1.2 μm. The invention is not limited to these dimensions, however, and any suitable dimensions may be used within the scope of the invention.

FIG. 2A also shows a second coplanar waveguide 30' formed in the top layer 20' of the second structure 25. The second coplanar waveguide 30' includes a signal line 35' and two ground lines 40a' and 40b', and may be formed in a manner similar to the first coplanar waveguide 30, e.g., using masking, etching, deposition, and planarization processes. The signal line 35' and ground lines 40a' and 40b' of the second coplanar waveguide 30' may be substantially the same as the signal line 35 and ground lines 40a and 40b of the first coplanar waveguide 30. Alternatively, any one of the signal line 35' and ground lines 40a' and 40b' of the second coplanar waveguide 30' may be formed with a different conductive material and/or dimension than the corresponding signal line 35 and ground lines 40a and 40b of the first coplanar waveguide 30. The second coplanar waveguide 30' may be formed at a different time than the first coplanar waveguide 30, or both may be formed at substantially the same time.

Figure 2B:
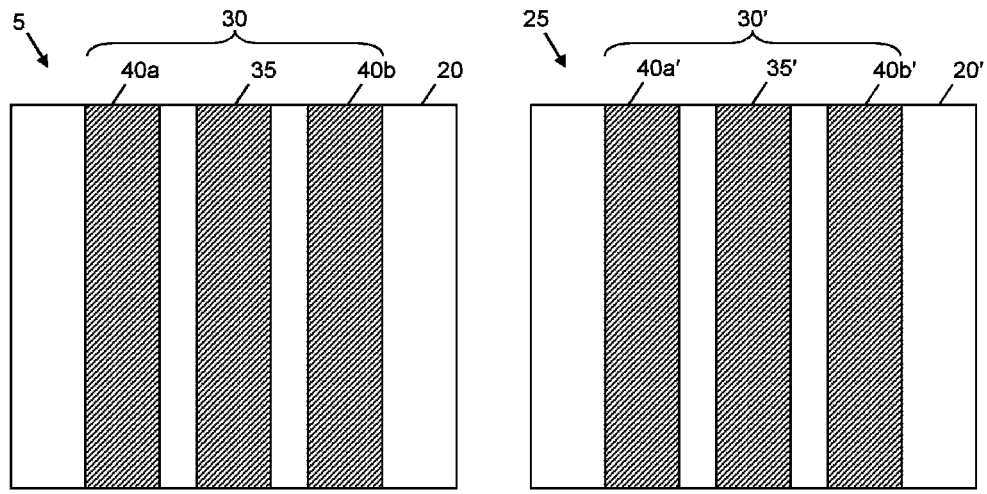

FIG. 2B shows a plan view (e.g., top down view) of the first structure 5 and the second structure 25 of FIG. 2A. In particular, FIG. 2B shows the first coplanar waveguide 30 comprising signal line 35 and ground lines 40a-b formed along a length of the top layer 20. FIG. 2B also shows the second coplanar waveguide 30' comprising signal line 35' and ground lines 40a'-b' formed along a length of the top layer 20'.

Figure 3A:
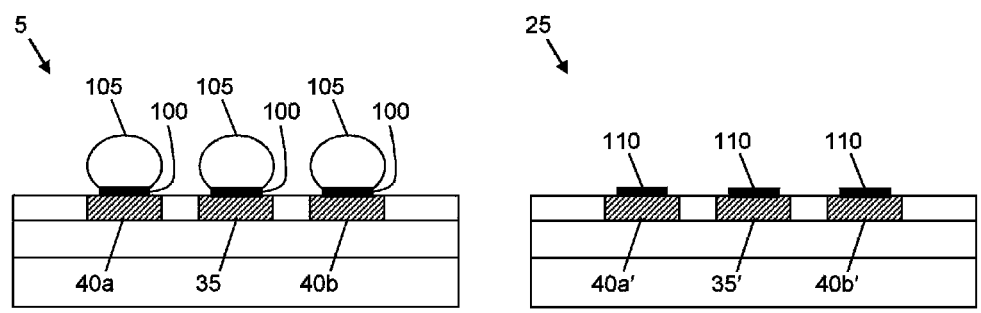
Figure 3B:
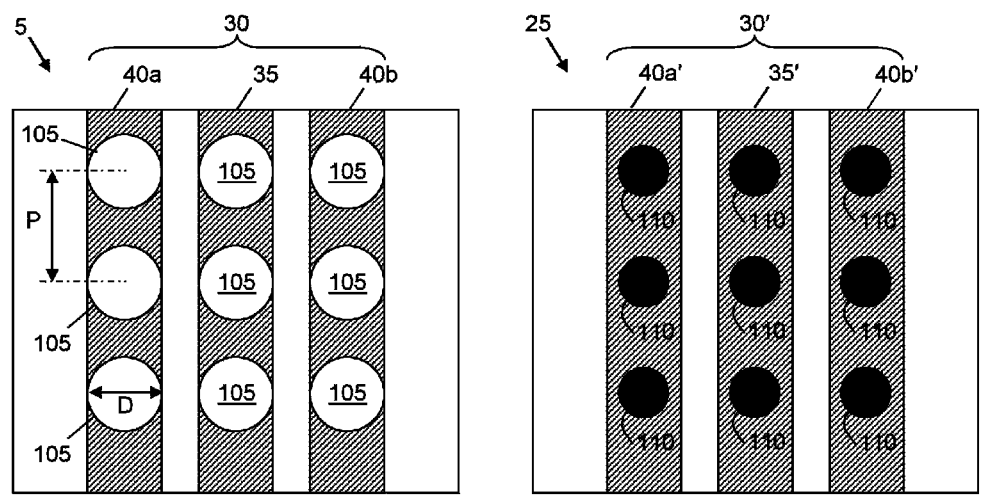

As shown in FIGS. 3A and 3B, and according to aspects of the invention, under-bump metallurgy (UBM) 100 and solder balls 105 are formed on each of the signal line 35 and ground lines 40a-b of the first structure 5. FIG. 3B is a plan view of FIG. 3A, and shows the solder balls 105 formed at plural locations along the length of each of the signal line 35 and ground lines 40a-b. The UBM 100 and solder balls 105 may comprise any suitable materials. For example, the UBM 100 may comprise a first layer of titanium-tungsten (TiW) formed on the signal line 35 and ground lines 40a-b, and a second layer of gold (Au) formed on the TiW, although any other materials and/or different numbers of layers may be used. The solder balls 105 may comprise, for example, gold (Au) and/or tin (Sn), although any other materials may be used.

The UBM 100 and solder balls 105 may be formed using suitable CMOS processing techniques. In embodiments, the solder balls 105 are micro-C4 balls, although any size solder ball may be used within the scope of the invention. In a first illustrative example, the UBM 100 is formed by sputtering a blanket layer of TiW on the top surface of first structure 5 (i.e., including on the top surface of each of the signal line 35 and ground lines 40a-b), and sputtering a blanket layer of Au on the TiW. A resist mask is formed on the Au and patterned to form openings where the solder balls 105 are to be formed, e.g., at locations along signal line 35 and ground lines 40a-b. Solder is formed in the openings in the resist mask by electroplating Sn on the exposed Au, and then electroplating Au on the Sn. The resist mask is stripped, and the exposed portions of the UBM 100 are etched using a wet etch or dry etch, leaving discrete shapes of UBM 100 and solder at locations along signal line 35 and ground lines 40a-b. The solder is then reflowed, which forms the shape exhibited by the solder balls 105.

In a second illustrative example, the UBM 100 and solder balls 105 are formed by first forming a liftoff mask, e.g., a resist material patterned with openings at the first locations and second locations. The UBM 100 and solder are formed in the openings of the liftoff mask by sputtering respective layers of material, e.g., TiW/Au/AuSn, etc., in the openings. The liftoff mask is then stripped and the solder is reflowed, leaving discrete shapes of UBM 100 and solder balls 105 at locations along signal line 35 and ground lines 40a-b.

Still referring to FIG. 3A, in accordance with aspects of the invention, an adhesion layer 110 may be formed on each of the signal line 35' and ground lines 40a'-b' of the second coplanar waveguide 30' in the second structure 25. In embodiments, the adhesion layer 110 comprises any material or combination of materials that are suitable for bonding with the material of the solder balls 105. For example, the adhesion layer 110 may comprise layers of TiW and Au formed on the signal line 35' and ground lines 40a'-b'. The adhesion layer 110 may be formed using CMOS processes, such as deposition, masking, and etching processes, e.g., similar to the UBM 100. The adhesion layer 110 may be formed at a different time than the UBM 100 and solder balls 105, or both may be formed at substantially the same time.

FIG. 3B shows the solder balls 105 formed at plural locations along the length of each of the signal line 35 and ground lines 40a-b of the first coplanar waveguide 30. In accordance with first aspects of the invention, the pitch "P" is greater than the diameter "D" of the solder balls 105, such that adjacent solder balls 105 do not physically contact one another. In embodiments, the UBM 100 and solder balls 105 are formed such that the nominal diameter "D" of a solder ball 105 is substantially equal to the width of the line on which the particular ball is formed (i.e., the signal line 35, the first ground line 40a, or the second ground line 40b), although the solder balls 105 may be formed with any desired diameter within the scope of the invention.

FIG. 3B also shows the adhesion layer 110 formed at plural locations along the length of each of the signal line 35' and ground lines 40a'-b' of the second coplanar waveguide 30'. According to aspects of the invention, the locations of the adhesion layer 110 on the second structure 25 are selected to correspond to the locations of the solder balls 105 on the first structure 5. In this manner, the adhesion layer 110 may serve to adhere to the solder balls 105 when the first structure 5 and second structure 25 are connected in a chip stack.

Figure 4:
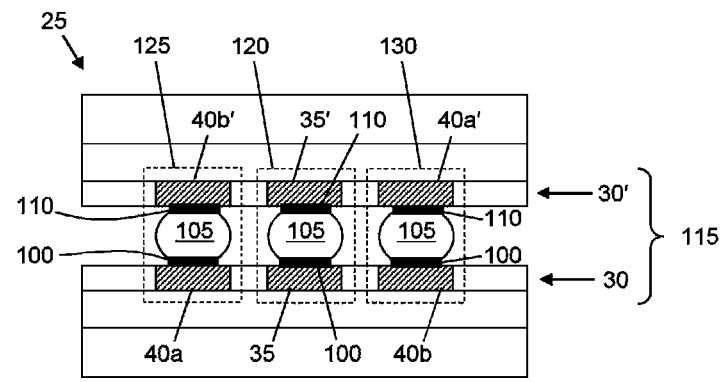

FIG. 4 shows the first structure 5 and the second structure 25 connected in a stacked chip (e.g., 3D integration) module in accordance with aspects of the invention. In embodiments, the first and second structures 5 and 25 are diced from their respective wafers after forming the solder balls 105 and adhesion layer 110. The second structure 25 is flipped (e.g., upside down relative to the first structure 5) and is connected to the first structure 5 (or vice versa). The connecting comprises bringing the plural portions of the adhesion layer 110 into physical contact with the corresponding plural solder balls 105, and reflowing (e.g., heating) the solder balls 105 to adhere the solder balls 105 to the adhesion layer 110. In this manner, a composite coplanar waveguide 115 (also referred to herein as a 3D coplanar waveguide) is formed by the combination of the first coplanar waveguide 30, the second coplanar waveguide 30', and the chip-to-chip interconnects, e.g., the UBM 100, solder balls 105, and adhesion layer 110.

Still referring to FIG. 4, by making such connections, the 3D coplanar waveguide 115 includes a signal line 120 that comprises signal line 35 and signal line 35', in addition to the UBM 100, solder balls 105, and adhesion layer 110 that physically and electrically connect the signal line 35 to the signal line 35'. Moreover, the 3D coplanar waveguide 115 includes a first ground line 125 that comprises ground line 40a and ground line 40b', in addition to the UBM 100, solder balls 105, and adhesion layer 110 that physically and electrically connect the ground line 40a to the ground line 40b'. Similarly, the 3D coplanar waveguide 115 includes a second ground line 130 that comprises ground line 40b and ground line 40a', in addition to the UBM 100, solder balls 105, and adhesion layer 110 that physically and electrically connect the ground line 40b to the ground line 40a'. The space between the first structure 5 and second structure 25 may be filled with an electrical insulating material, such as an underfill material used in flip chip packaging.

Figure 5:
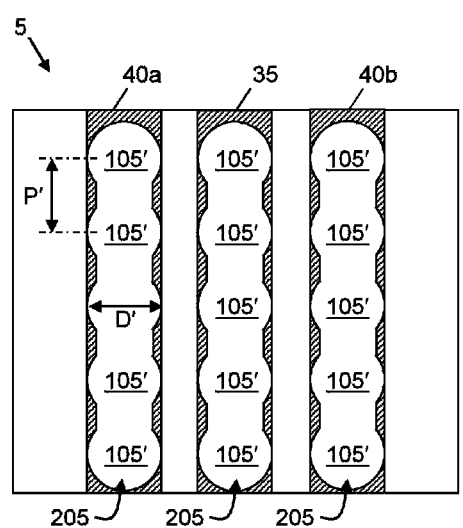

FIG. 5 shows a plan view of an alternate embodiment of the first structure 5' at the same stage of processing as depicted in FIG. 3B. As shown in FIG. 5, and in accordance with aspects of the invention, the pitch P' may be selected to be less than the diameter D' of the solder balls 105'. In this manner, when the solder material is reflowed to form the solder balls 105', adjacent ones of the solder balls 105' come into physical contact with one another, thus forming continuous solder structures 205 along the signal line 35 and ground lines 40a-b. The first structure 5' having the continuous solder structures 205 may be connected to a second structure (e.g., second structure 25 of FIG. 4) to form a 3D coplanar waveguide, e.g., in a manner similar to that described with respect to FIG. 4.

Figure 7:
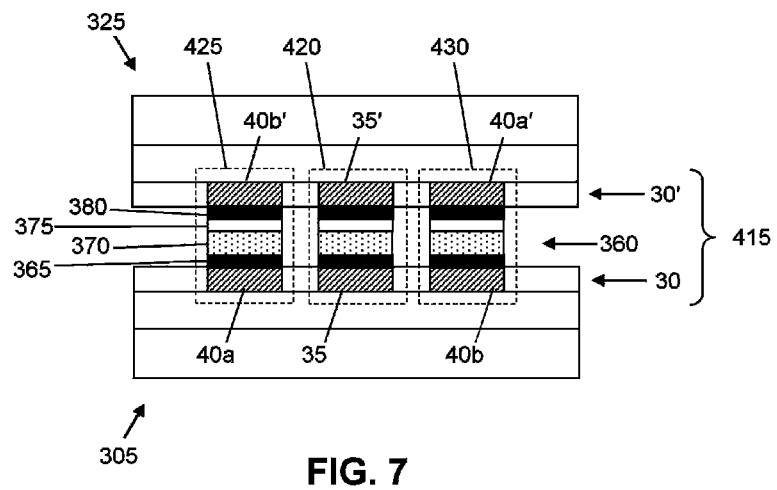

FIGS. 6A, 6B, and 7 show an embodiment in which copper pillars, rather than solder balls, are used as the between-chip interconnects. In particular, FIG. 6A shows a cross sectional view of a first structure 305 and a second structure 325. FIG. 6B is a plan view of the structures 305 and 325 of FIG. 6A. The first structure 305 may be similar to the first structure 5 in that it comprises a substrate 10, intermediate layer 15, top layer 20, and first coplanar waveguide 30 comprising a signal line 35 and ground lines 40a-b in the top layer 20. The second structure 325 may be similar to the second structure 25 in that it comprises a substrate 10', intermediate layer 15', top layer 20', and second coplanar waveguide 30' comprising a signal line 35' and ground lines 40a'-b' in the top layer 20'.

As depicted in FIGS. 6A and 6B, and in accordance with aspects of the invention, plural copper pillars 360 are formed on the signal line 35 and ground lines 40a-b of the first structure 305. The copper pillars 360, which are sometimes referred to as copper pillar bumps, may be formed using any desired CMOS processes and materials. For example, each copper pillar 360 may comprise a UBM layer 365, a copper layer 370, and a solder layer 375. In but one example of fabrication, the copper pillars 360 may be formed by a process comprising: sputtering one or more layers of UBM material (e.g., TiW, Au, etc.) on the top surface of the first structure 305; sputtering a seed layer on the one or more layers of UBM material; forming a layer of resist on the seed layer; patterning the resist material to form holes exposing portions of the seed layer; electroplating copper in the holes using the seed layer; forming (e.g., plating or printing) solder on the plated copper; reflowing the solder; stripping the resist material; and removing (e.g., etching) uncovered portions of the seed layer and UBM material.

Still referring to FIGS. 6A and 6B, the second structure is provided with an adhesion layer 380 formed at a plurality of locations on the signal line 35' and ground lines 40a' and 40b'. The adhesion layer 380 may be formed using materials and processes similar to those described above with respect to adhesion layer 110. The location of the discrete portions of the adhesion layer 380 on the second coplanar waveguide 30' corresponds to the locations of the copper pillars 360 on the first coplanar waveguide 30.

With continued reference to FIGS. 6A and 6B, in embodiments, the copper pillars 360 are formed such that the width of each copper pillar 360 is substantially equal to the width of the line on which the particular feature is formed (i.e., the signal line 35, the ground line 40a, or the ground line 40b), although the copper pillars 360 may be formed with any desired width within the scope of the invention. Similarly, in embodiments, the adhesion layer 380 is formed such that the width of each particular portion of the adhesion layer 380 is substantially equal to the width of the line on which the particular feature is formed (i.e., the signal line 35', the ground line 40a', or the ground line 40b'), although the adhesion layer 380 may be formed with any desired width within the scope of the invention.

FIG. 7 shows the first structure 305 and the second structure 325 connected in a stacked chip (e.g., 3D integration) module in accordance with aspects of the invention. In embodiments, the first structure 305 and the second structures 325 are diced from their respective wafers after forming the copper pillars 360 and adhesion layer 380. The second structure 325 is flipped (e.g., upside down relative to the first structure 5) and is connected to the first structure 305 (or vice versa). The connecting comprises bringing the plural portions of the adhesion layer 380 into physical contact with the solder 375 on the corresponding copper pillars 360, and reflowing (e.g., heating) the solder 375 to adhere the copper pillars 360 to the adhesion layer 380. In this manner, a composite coplanar waveguide 415 (also referred to herein as a 3D coplanar waveguide) is formed by the combination of the first coplanar waveguide 30, the second coplanar waveguide 30', and the chip-to-chip interconnects, e.g., the UBM 365, copper 370, solder 375, and adhesion layer 380.

Still referring to FIG. 7, the 3D coplanar waveguide 415 includes a signal line 420 that comprises signal line 35 and signal line 35', in addition to the UBM 365, copper 370, solder 375, and adhesion layer 380 that physically and electrically connect the signal line 35 to the signal line 35'. Moreover, the 3D coplanar waveguide 415 includes a first ground line 425 that comprises ground line 40a and ground line 40b', in addition to the UBM 365, copper 370, solder 375, and adhesion layer 380 that physically and electrically connect the ground line 40a to the ground line 40b'. Similarly, the 3D coplanar waveguide 415 includes a second ground line 430 that comprises ground line 40b and ground line 40a', in addition to the UBM 365, copper 370, solder 375, and adhesion layer 380 that physically and electrically connect the ground line 40b to the ground line 40a'. The space between the first structure 305 and second structure 325 may be filled with an electrical insulating material, such as an underfill material.

Figure 8:
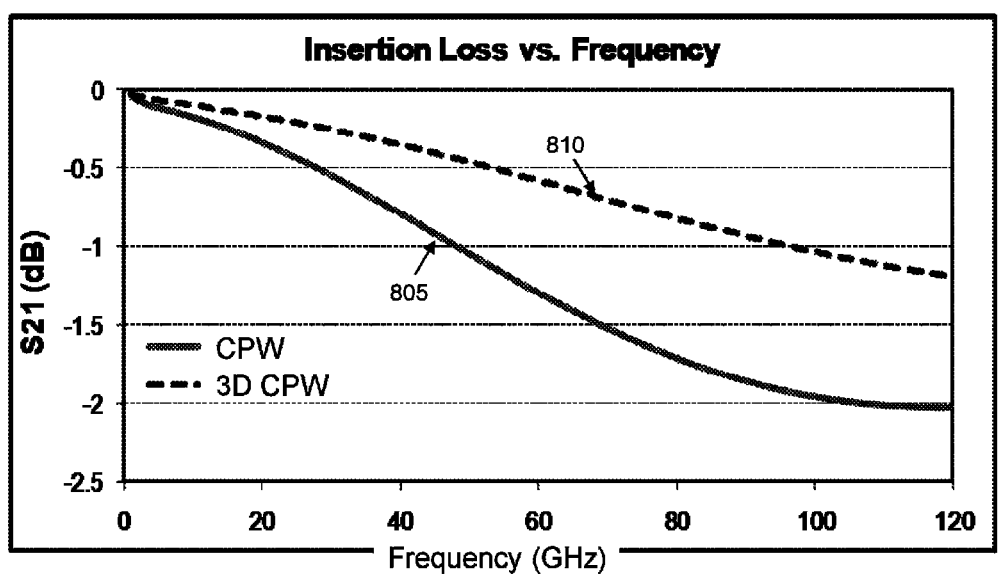
FIG. 8 shows a graph of simulation data.

FIG. 8 shows a graph of simulation data of insertion loss of a single coplanar waveguide (e.g., coplanar waveguide 30 in FIG. 2A) and a 3D coplanar waveguide (e.g., 3D coplanar waveguide 115 in FIG. 4). The x-axis represents frequency and the y-axis represents loss. Curve 805 corresponds to the single coplanar waveguide, and curve 810 corresponds to the 3D coplanar waveguide. The model single coplanar waveguide used in this simulation has the following dimensions: signal line width=2 μm; ground line width=7 μm; signal and ground line thickness=1.2 μm; signal and ground line length=500 μm. The model 3D coplanar waveguide used in this simulation comprises two of the single coplanar waveguides connected by micro-C4 solder balls having a diameter of 6.8 μm (e.g., similar to the manner shown in FIG. 4). The curves 805 and 810 demonstrate that the 3D coplanar waveguide fabricated in accordance with aspects of the invention exhibits substantially less loss than the single coplanar waveguide.

As described herein, the solder balls and the copper pillars constitute a plurality of chip-to-chip connections that directly connect a first coplanar waveguide formed in a first chip to a second coplanar waveguide formed in a second chip. As used herein, the chip-to-chip connections include any UBM and adhesion layers used in association with the solder balls and the copper pillars.

The 3D coplanar waveguide fabricated in accordance with aspects of the invention offers performance advantages over conventional coplanar waveguides that can be fabricated in any back-end-of-line metal dielectric stack (BEOL) of any of the individual chips in the stacked multi-chip system. For example, the 3D coplanar waveguide fabricated in accordance with aspects of the invention offers: lower loss coplanar waveguides possible than in any individual chip's BEOL stack; and less noise introduced when crossing from a coplanar waveguide in one chip BEOL across solder balls to another coplanar waveguide in another chip BEOL.

The 3D coplanar waveguide fabricated in accordance with aspects of the invention for stacked multi-chip systems forms coplanar waveguides using the solder between the chips as well as the topmost metal layers of the individual chips. The solder can be used as long conductors matching the general dimensions of the two coplanar waveguides in the two chip BEOLs (the two conventional coplanar waveguides in the two chips may have the same or similar dimensions) or the solder employed can be many individual solder balls connecting the corresponding conductors of the two chip BEOL coplanar waveguides.

Figure 9:
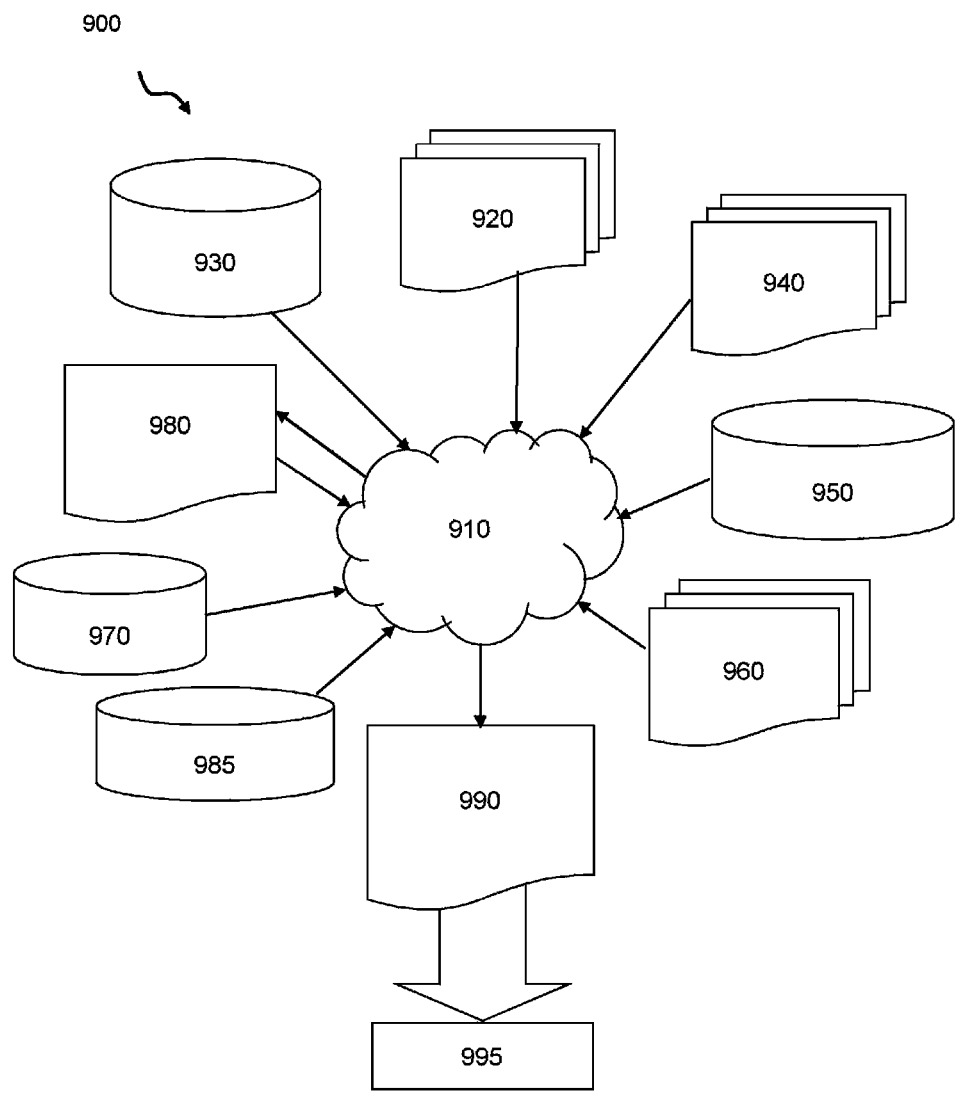
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2A, 2B, 3A 3B, 4, 5, 6A, 6B, and 7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2A, 2B, 3A 3B, 4, 5, 6A, 6B, and 7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2A, 2B, 3A 3B, 4, 5, 6A, 6B, and 7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2A, 2B, 3A 3B, 4, 5, 6A, 6B, and 7. In one embodiment, design structure 990 may comprise a compiled, executable HDL simulation model that functionally simulates the devices shown in FIGS. 1, 2A, 2B, 3A 3B, 4, 5, 6A, 6B, and 7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2A, 2B, 3A 3B, 4, 5, 6A, 6B, and 7. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of manufacturing a semiconductor structure, comprising:
   forming a first coplanar waveguide in a first chip;
   forming a second coplanar waveguide in a second chip; and
   directly connecting the first coplanar waveguide to the second coplanar waveguide using a plurality of chip-to-chip connections.

2. The method of claim 1, wherein the connecting the first coplanar waveguide to the second coplanar waveguide comprises stacking the first and second chips in a stacked chip module.

3. The method of claim 1, wherein the plurality of chip-to-chip connections comprises a plurality of solder balls, and further comprising forming the plurality of solder balls on a signal line and ground lines of the first coplanar waveguide.

4. The method of claim 3, further comprising:
   forming an adhesion layer on a signal line and ground lines of the second coplanar waveguide; and
   connecting the plurality of solder balls to the adhesion layer.

5. The method of claim 3, further comprising forming the plurality of solder balls to have a nominal diameter that is substantially equal to at least one of: a width of the signal line of the first coplanar waveguide, and a width of the ground lines of the first coplanar waveguide.

6. The method of claim 3, further comprising forming the plurality of solder balls to have a pitch and a nominal diameter, wherein the pitch is greater than the nominal diameter such that there is a space between adjacent ones of the plurality of solder balls.

7. The method of claim 3, further comprising forming the plurality of solder balls to have a pitch and a nominal diameter, wherein the pitch is less than the nominal diameter such that adjacent ones of the plurality of solder balls contact one another.

8. The method of claim 1, wherein the plurality of chip-to-chip connections comprises a plurality of copper pillars, and further comprising forming the plurality of copper pillars on a signal line and ground lines of the first coplanar waveguide.

9. The method of claim 8, further comprising:
   forming an adhesion layer on a signal line and ground lines of the second coplanar waveguide; and
   connecting the plurality of copper pillars to the adhesion layer.

10. The method of claim 9, further comprising forming the adhesion layer at plural discrete locations on the second coplanar waveguide that correspond to locations of the plurality of copper pillars on the first coplanar waveguide.

11. A method of forming a semiconductor structure, comprising:
    forming a first coplanar waveguide comprising a signal line and ground lines in top layer of a first chip;
    forming a second coplanar waveguide comprising a signal line and ground lines in top layer of a second chip;
    forming a plurality of connection structures on each of the signal line of the first coplanar waveguide and the ground lines of the first coplanar waveguide; and
    connecting the signal line of the second coplanar waveguide and the ground lines of the second coplanar waveguide to the plurality of connection structures.

12. The method of claim 11, wherein the forming the plurality of connection structures comprises forming a plurality of solder balls on each of the signal line of the first coplanar waveguide and the ground lines of the first coplanar waveguide.

13. The method of claim 11, wherein the forming the plurality of connection structures comprises forming a plurality of copper pillars on each of the signal line of the first coplanar waveguide and the ground lines of the first coplanar waveguide.

14. The method of claim 11, further comprising forming an adhesion layer on the signal line of the second coplanar waveguide and the ground lines of the second coplanar waveguide.

15. The method of claim 14, wherein:
    the plurality of connection structures comprise solder; and
    the connecting comprises bringing the solder into contact with the adhesion layer and reflowing the solder.

16. A semiconductor structure, comprising:
    a composite coplanar waveguide comprising:
       a first coplanar waveguide in a first chip;
       a second coplanar waveguide in a second chip; and
       a plurality of chip-to-chip connections that directly connect the first coplanar waveguide to the second coplanar waveguide.

17. The structure of claim 16, wherein:
    the first coplanar waveguide is in a top layer of the first chip;
    the second coplanar waveguide is in a top layer of the second chip; and
    the first chip and the second chip are connected in a stacked chip module.

18. The structure of claim 16, wherein the plurality of chip-to-chip connections comprises a plurality of solder balls with a space between adjacent ones of the plurality of solder balls.

19. The structure of claim 16, wherein the plurality of chip-to-chip connections comprises a plurality of solder balls that contact one another.

20. The structure of claim 16, wherein the plurality of chip-to-chip connections comprises a plurality of copper pillars.

* * * * *